TRANSISTORIZED LOGIC CIRCUIT OPERATIVE IN THE PULSE MODE

Filed Dec. 31, 1958

INVENTORS
W. N. CARROLL
R. A. COOPPER
R. G. COUNIHAN

BY Edgar H. Kent
ATT'Y

United States Patent Office 3,087,074
Patented Apr. 23, 1963

3,087,074

TRANSISTORIZED LOGIC CIRCUIT OPERATIVE IN THE PULSE MODE

William N. Carroll, Rhinebeck, Roderick A. Coopper, Hyde Park, and Richard G. Counihan, Kingston, N.Y., assignors to International Business Machines Corporation, New York, N.Y., a corporation of New York
Filed Dec. 31, 1958, Ser. No. 784,371
8 Claims. (Cl. 307—88.5)

Figure 1:
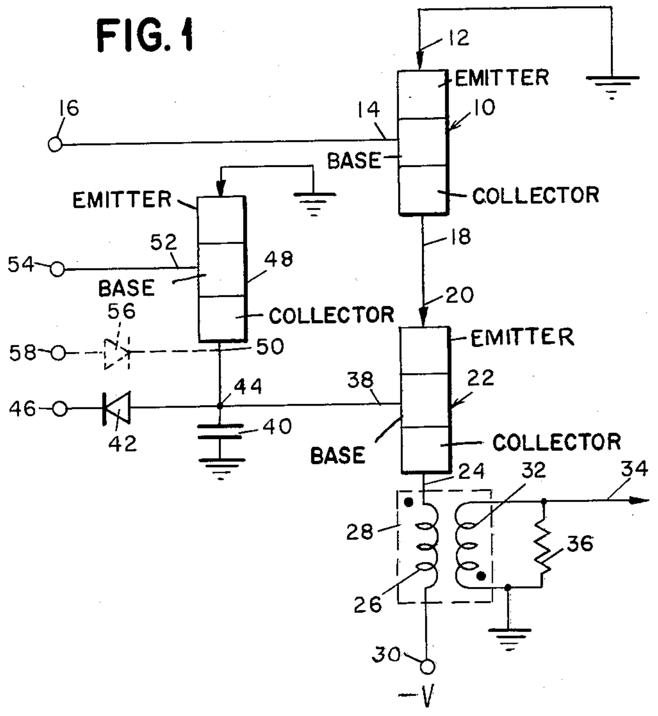

This invention relates to logical circuitry adapted for use in data processing machines and more particularly to logical circuitry of that type adapted for operation in the pulse mode.

The logical circuitry heretofore employed has conventionally utilized so-called D.C. levels (signals having longer durations than the contrasting pulse signals) as conditioning levels and control levels in the operation of data processing equipment. Such circuitries are satisfactory in equipment operating at the rates of speed presently utilized. However, as an attempt is made to achieve higher operating speeds (pulse repetition frequencies above five megacycles per second) problems occur due to the varying characteristics of certain of the involved circuit elements. For example, during D.C. level operation of transistors the variation in the amplification factor, beta, is frequently substantial. At the present time it is impossible to achieve sufficient uniformity of the D.C. characteristics of transistors to satisfactorily incorporate them in reliable high speed logical circuitry utilizing the D.C. level mode of operation. Under pulse conditions, however, high collector currents flow when the transistors are turned on and the amplification factors of all transistors decrease to substantially the same small value so that uniformity of transistor operation may be obtained.

Accordingly, it is an object of this invention to provide a simple and reliable logical circuit which is capable of operation at high pulse repetition frequencies and which is capable of operating independently of D.C. level signals.

Another object of the invention is to provide a high speed gating circuit which utilizes a pulse mode of operation exclusively rather than a D.C. level mode of logical operation.

A related object of the invention is to provide a novel, simple and reliable high speed bistable logical circuit capable of operating in the pulse mode.

The invention provides an electric charge storage circuit including a transistor having an input circuit and an output circuit, each of which has an asymmetrically conductive path. A capacitor is connected in shunt with the input circuit and is adapted to be charged by a signal source, through a unidirectional current device, to a potential sufficient to bias the input circuit in its low impedance direction. Means associated with the transistor inhibit conduction in its output circuit even though its input circuit is suitably biased. This inhibit is removable by a pulse, and if the input circuit is appropriately conditioned the transistor will produce an output signal. Although the charge on the capacitor is removed by conduction of the transistor the resultant output signal may be fed back to restore the charge on the capacitor, thereby replacing the conditioning potential on the input circuit. The conditioning potential is removed by discharging the capacitor. With slight modification, this circuitry can be arranged to provide a bistable characteristic whereby a sampling pulse periodically applied to the circuit will produce an output signal indicative of the condition of the circuitry. The circuitries are suitable for use in high speed logical applications in data handling systems, are simple and reliable, and do not require D.C. levels to perform the applicable logical functions.

Figure 2:
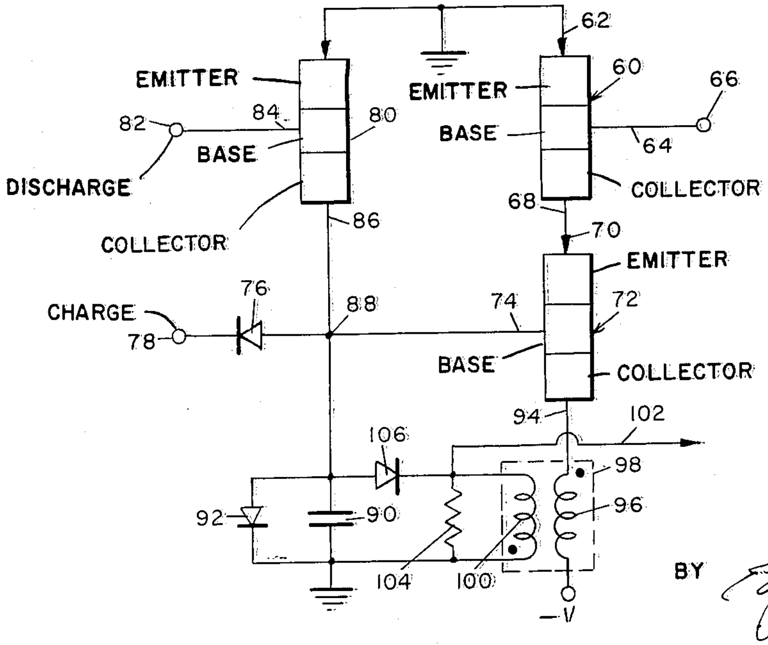

Further objects and advantages of the invention will be seen as the following description of a preferred embodiment of the invention progresses, in conjunction with the drawings, in which:

FIG. 1 is a schematic diagram of a logical gating circuit according to a preferred embodiment of the invention; and FIG. 2 is a schematic diagram of a bistable circuit resulting from slight changes in the logical gating circuit shown in FIG. 1.

A logical gating circuit according to a preferred embodiment of the invention is shown in FIG. 1. The circuit includes two PNP microalloy diffused junction transistors, each of which is connected in grounded emitter configuration. The transistor 10 has an emitter electrode 12 which is grounded, a base electrode 14 which is connected to a source of pulses at terminal 16 and a collector electrode 18 which is connected to the emitter electrode 20 of the transistor 22. The collector electrode 24 of transistor 22 is connected to the primary winding 26 of a pulse transformer 28. The second terminal 30 of the primary winding 6 is connected to a source of negative potential, 10 volts in magnitude. The secondary winding 32 of the transformer 28 is connected to an output line 34. A load balancing resistor 36 is connected across the secondary winding and its value is dependent on the type and magnitude of the load connected to the output line.

The base electrode 38 of the transistor 22 is connected to an electrostatic storage circuit which consists of a capacitor 40, one terminal of which is grounded and the other terminal is connected to the base electrode, and a diode 42 which has its anode connected to the base electrode 38 and to the capacitor terminal at junction 44 and its cathode connected to terminal 46.

This circuit operates as a gating circuit in the following manner. A negative going pulse one volt in amplitude, applied at terminal 46, is passed by the diode 42 to charge the capacitor to approximately −1.0 volt. The diode 42 is a unidirectional current device which has a high resistance in the reverse direction that tends to prevent the charge on the capacitor from leaking off in the direction towards terminal 46 and as the input circuit of transistor 22 does not provide a conducting path for the current, the charge will remain on the capacitor for a sufficient period of time for use in logical pulse circuitry. With the presently available components the capacitor will retain sufficient conditioning potential for a period of at least 500 millimicroseconds.

If, while the capacitor 40 is charged, a pulse is applied to the base electrode 14 via terminal 16 that pulse will forward bias the emitter base junction of transistor 10 and permit current flow in that transistor's output circuit. This current flow will establish a conducting path for the input circuit of transistor 22 and the emitter base junction will become forward biased due to the potential on the base electrode 38 as impressed from capacitor 40. That transistor will be turned On and the resulting current flow in its output circuit and through the primary winding 26 of transformer 28 will induce a signal in the secondary winding 32. The transformer is poled to invert the polarity of the signal and produces a negative pulse of suitable shape on line 34. If, however, there was no charge on the capacitor 40 when a pulse is applied at terminal 14 the emitter base junction of transistor 22 will not become forward biased and no output pulse will be produced. Thus the circuit provides a gating function solely through the use of pulse signals and the problems, encountered in high speed transistorized circuitry with D.C. levels, are avoided. It will be understood of course that various current limiting resistors, for example, may be necessary with certain transistor constructions, and other circuit elements may be utilized in conjunction with the base electrodes to insure an adequate supply of $I_{co}$. These elements, which are well known and within the capability of those having ordinary skill in the art, are omitted. The elements shown in this preferred embodiment are the following types and values: Transistors 10 and 22, Philco type 2N501 diffused base transistors; pulse transformer 30, 8 to 1 step down ratio; capacitor 40, 680 micromicrofarads; and diode 42, Transitron type 1N279.

If it is desired to remove the charge from the capacitor 40, thereby deconditioning the gating circuit, a transistor 48, connected in grounded emitter configuration, may have its collector electrode 50 connected to the junction 44 such that a negative going pulse signal applied to its base electrode 52 via terminal 54 will forward bias the emitter base junction and produce conduction in its output circuit, thereby discharging the capacitor and returning the junction 44 to ground potential. An alternative means of removing charge from capacitor 40 is to provide a diode 56 as indicated in dotted construction. The anode of the diode is connected to terminal 58 and its cathode is connected to the junction 44. Terminal 58 is normally biased to a potential equal to or below the potential of the input pulse applied at terminal 46. The application of a positive going pulse which raises the potential of junction 44 to ground would remove the charge on the capacitor, thereby deconditioning the gating circuit.

While the transistors here shown are of the PNP type, it will, of course, be understood that, with appropriate changes in polarity, NPN transistors are also susceptible to use in the circuitry of the invention.

The gating circuit may be modified to provide a bistable circuit suitable for use in logical circuitry associated with data processing equipment which utilize binary coded information, for example. Such a circuit is shown in FIG. 2. A PNP transistor 60, connected in grounded emitter configuration with its emitter electrode 62 being grounded, has its base electrode 64 connected to a source of clock pulses at terminal 66 and its collector electrode 68 connected to the emitter electrode 70 of a second PNP transistor 72. The base electrode 74 of that transistor is connected through a unidirectional current device 76 to one input terminal 78 of the flip-flop and through a PNP transistor 80 to a second input terminal 82 of the circuit. The transistor 80 is also connected in grounded emitter configuration such that a negative going signal applied to its base electrode 84 via terminal 82 will forward bias its emitter base junction and produce conduction in its output circuit through its collector electrode 86.

Also connected to the junction 88 between the input elements and the base 74 is one terminal of a capacitor 90, the other terminal of which is grounded. A diode 92 is connected across the capacitor such that the junction 88 is clamped at ground and cannot rise above that potential.

A charge is impressed on the capacitor 90 by a negative going signal applied at input terminal 78 and this capacitor acts to maintain the junction 88 at that potential. If, while the junction 88 is at that negative potential, a clock or strobe pulse is applied at terminal 66 which turns the transistor 60 on, the emitter base junction of transistor 72 becomes forward biased with resultant conduction in its output circuit comprising emitter electrode 70 and collector electrode 94. Connected to the collector electrode 94 is the primary winding 96 of a pulse transformer 98 which has a secondary winding 100 poled to invert the polarity of a signal applied to the primary winding. The secondary winding 100 is connected between ground and an output line 102. A load balancing resistor 104 is connected across the secondary winding and also connected to the secondary winding is a diode 106 whose anode is connected to the ungrounded terminal of capacitor 90.

When a clock pulse is applied to transistor 60 and the capacitor 90 is charged an output pulse is produced on line 102. This output signal is also passed by diode 106 and restores the charge on the capacitor 90 which was removed during the conduction of transistor 72, thus reestablishing the status of the circuit prior to the application of the clock pulse.

If, however, the capacitor 90 was discharged when the clock pulse was applied to terminal 66 no output signal is produced as the transistor 72 would not be conditioned for conduction and the capacitor would remain discharged, again maintaining the condition of the bistable circuit.

Thus the circuit can be set to one state by a pulse signal applied at terminal 78 (capacitor charged) and to a second state by a pulse signal applied at terminal 82 (capacitor discharged). Periodic pulses applied at terminal 66 interrogate the status of the circuit and maintain the condition of the circuit until its status is changed. The circuit is conditioned by pulse signals exclusively rather than by a combination of pulse signals and D.C. level signals as has been the case in convention types of bistable circuits used in computer logic.

Thus it is seen that the pulse gating circuit may be easily converted to a bistable circuit. The basic circuit configuration may also be utilized, if desired in various combinations to provide certain logical functions. For example, without the feedback circuit as shown in FIG. 2 and terming the input at terminal 66 as A, the input at terminal 78 as B, the input at terminal 82 as C, an output signal on line 102 would represent the logical function ($AB\overline{C}$) where A is not synchronous with B and C.

While preferred embodiments of the invention have been shown and described it will be understood that the invention is not intended to be limited thereto or to details thereof and departures may be made therefrom within the spirit and scope of the invention as defined in the following claims.

We claim:

1. A logical circuit adapted to be connected to a high speed binary pulse system comprising a transistor having an input circuit having two terminals and an output circuit, input signal coupling means including a unidirectional current device connected to one terminal of said input circuit and a capacitor connected in shunt with said input circuit, switch means connected to the other terminal of said input circuit and adapted to complete said input circuit when said switch means is conditioned by a pulse signal of predetermined polarity, a load impedance and a source of unidirectional electrical potential connected in series to said output circuit, means to apply a conditioning pulse of predetermined polarity to said coupling means to charge said capacitor to a potential sufficient to bias said input circuit to establish conduction in said transistor output circuit only when said switch means is conditioned, said unidirectional current device being adapted to maintain said charge on said capacitor, and means to apply a pulse of predetermined polarity to said switch means to condition said switch means whereby said transistor is enabled to conduct thereby generating an output pulse signal in said output load impedance whenever said capacitor is charged to said potential.

2. The apparatus as claimed in claim 1 wherein said switch means includes a second transistor having an output circuit connected to said other terminal of said first transistor and an input circuit, means to apply pulses to said second input circuit to cause said second output circuit to conduct, thus enabling the turn on of said first transistor only when said capacitor is charged to said potential.

3. The apparatus as claimed in claim 1 and further including means responsive to said output pulse signal coupled between said load impedance and said input circuit adapted to cause said capacitor to be returned to said charged state upon generation of an output signal.

4. A logical circuit adapted to be connected to a source of electric pulses comprising a transistor having an input circuit having two terminals and an output circuit, each circuit defining an asymmetrically conductive current path, a capacitive element connected to one terminal of said input circuit, means including a unidirectional current device adapted to apply said pulses to said input circuit and to change the state of charge of said capacitive element from a first state to a second state, said unidirectional current device being poled to inhibit the return of the charge of said element to said first state, and means associated with the other terminal of said input circuit adapted normally to prevent turn on of said transistor, said means being responsive to a pulse of predetermined polarity to turn on said transistor only when said capacitive element is in said second state of charge, thereby permitting a pulse of current flow from said capacitive element to produce an output pulse in said output circuit, said pulse of current flow returning said capacitive element to said first state of charge.

5. The logical circuit as claimed in claim 4 and further including means to restore said capacitive element to said second state of charge in response to said output pulse.

6. The logical circuit as claimed in claim 4 and further including means for resetting said capacitive element from said second state to said first state of charge independently of said pulse of current flow from said capacitive element.

7. A logical circuit adapted to be connected to a source of electrical pulses including first and second PNP transistors, each including a base electrode, an emitter electrode and a collector electrode, the emitter of said first transistor being grounded, means to apply a gating pulse to the base of said first transistor adapted to turn it on, the collector of the said first transistor being connected to the emitter of said second transistor, a capacitor connected in shunt to the base of said second transistor, means including a diode responsive to an input pulse signal adapted to charge said capacitor to apply a biasing potential to the emitter base junction of said second transistor, said diode being poled to maintain the biasing potential on said capacitor, the collector of said second transistor connected to a transformer poled to invert the polarity of a signal applied thereto, said circuit being adapted to produce an output pulse of the same polarity as said gating pulse whenever said capacitor is charged and a gating pulse is applied to said first transistor, said circuit being arranged so that any biasing potential on said capacitor is removed when said gating pulse is applied to said first transistor.

8. The logical circuit as claimed in claim 1 wherein said load impedance is a transformer having a primary winding and a secondary winding, said primary winding being connected in series between said output circuit and said source of unidirectional electrical potential, and further including means to recharge said capacitor comprising a feedback circuit including said transformer secondary winding and a unidirectional current device, said feedback circuit being connected across said capacitor so that said feedback circuit applies a pulse of current to recharge said capacitor to a potential sufficient to bias said input circuit to establish conduction in said transistor output circuit in response to each output signal.

References Cited in the file of this patent

UNITED STATES PATENTS

| | | |
|---|---|---|
| 2,719,225 | Morris | Sept. 27, 1955 |
| 2,725,471 | Appelton | Nov. 29, 1955 |
| 2,827,574 | Schneider | Mar. 18, 1958 |
| 2,885,573 | Clapper | May 5, 1959 |
| 2,902,674 | Billings et al. | Sept. 1, 1959 |
| 2,925,585 | Bruce | Feb. 16, 1960 |
| 2,933,689 | Johnson | Apr. 19, 1960 |

OTHER REFERENCES

"Directly Coupled Transistor Circuits" by Beter, Bradley, Brown and Rubinoff, from Electronics, June 1955, pages 132–136.